(12) United States Patent
Waterhouse et al.

(10) Patent No.: US 7,353,330 B2
(45) Date of Patent: Apr. 1, 2008

(54) METHOD AND APPARATUS FOR PERFORMING REPEATED CONTENT ADDRESSABLE MEMORY SEARCHES

(75) Inventors: Richard Waterhouse, Ottawa (CA); Robert N. McKenzie, Ottawa (CA); Lawrence King, Carp (CA)

(73) Assignee: Mosaid Technologies Incorporated, Kanata, Ontario (CA)

( * ) Notice: Subject to any disclaimer, the term of this patent is extended or adjusted under 35 U.S.C. 154(b) by 935 days.

(21) Appl. No.: 10/425,957

(22) Filed: Apr. 30, 2003

(65) Prior Publication Data

US 2004/0165608 A1    Aug. 26, 2004

Related U.S. Application Data

(60) Provisional application No. 60/448,893, filed on Feb. 24, 2003.

(51) Int. Cl.
*G06F 12/00* (2006.01)
(52) U.S. Cl. ....................................... 711/108
(58) Field of Classification Search ................ 711/108; 714/747; 365/200
See application file for complete search history.

(56) References Cited

U.S. PATENT DOCUMENTS 5,546,559 A *  8/1996  Kyushima et al. .......... 711/133
5,608,684 A *  3/1997  Reasoner et al. ........... 365/228
6,633,945 B1 * 10/2003  Fu et al. ..................... 710/316
6,772,316 B2 *  8/2004  Lyon .......................... 711/207

OTHER PUBLICATIONS

Mike Ichiriu, White Paper, "High Performance Layer 3 Forwarding The Need for Dedicated Hardware Solutions", NetLogic Microsystems, pp. 2-6; 2000.

* cited by examiner

Primary Examiner—Reginald Bragdon
Assistant Examiner—Aracelis Ruiz
(74) Attorney, Agent, or Firm—Anne Kinsman; Borden Ladner Gervais LLP (57) ABSTRACT

A method for reducing the number of cycles required for setting up content addressable memory contexts is disclosed. In particular, the method reduces the number of cycles required for setting up multiple contexts of burst operations, in which each context includes the same data key. Each context includes a special field that is set by the user, called a data reuse field. Setting the data reuse field to a first state indicates that the data from the corresponding context is to be used in the operation. Setting the data reuse field to a second state indicates that the data from the most recent operation is to be used instead. Hence the search data key can be written to a single context, avoiding consumption of cycles required for writing the same search data key to subsequent contexts of the burst operation.

10 Claims, 7 Drawing Sheets

METHOD AND APPARATUS FOR PERFORMING REPEATED CONTENT ADDRESSABLE MEMORY SEARCHES

The present application claims priority to U.S. Provisional Application No. 60/448,893 filed on Feb. 24, 2003, the contents of which are, by reference, incorporated herein in their entirety.

FIELD OF THE INVENTION

The present invention relates to content addressable memories. In particular, the present invention relates to a method for searching content addressable memories.

BACKGROUND OF THE INVENTION

Content Addressable Memory (CAM) devices have been developed as an alternative to traditional memory devices such as well known DRAM and SRAM devices. CAM allows cells to be referenced by their contents, so it has found use in lookup table implementations such as cache memory subsystems and is now rapidly finding use in networking systems. A valuable feature of a CAM is its ability to perform a search and compare of multiple locations as a single operation, in which search data is compared with data stored within the CAM. Typically search data is loaded onto search lines and compared with stored words in the CAM. During a search-and-compare operation, a match or mismatch signal associated with each stored word is generated on a matchline, indicating whether the search word matches a stored word or not. The physical address of stored words that match the search data is then provided to the system for subsequent use. Examples of CAM architectures and circuits that illustrate the operation of CAM's are disclosed in commonly owned U.S. Pat. Nos. 6,320,777, 6,442,090, 6,307,798, 6,552,596, and 6,504,775.

CAM's are typically integrated within a system to provide content based search capability, where one or more CAM devices of the system define a search table having a number of entries equal to the sum of the capacities of each CAM device. CAM devices are available in a variety of densities, hence the desired total search table size of the system will determine the number of CAM devices to cascade together.

It is commonly desired to execute the same search repeatedly upon the CAM device in a networked system application. This involves setting up, or generating a data structure called a context comprising an instruction and search data each time a search operation is to be executed, which requires several cycles to setup. Accordingly, cycles are wasted if the same search operation is to be executed repeatedly. Thus to increase search efficiency, CAM contexts are used to store preset search instructions and search data, which can be executed with a single command. Each CAM context includes instruction bits, status bits and data bits sufficient to execute an operation on the CAM. Contexts can further include other control and configuration bits, all of which are stored in registers.

Figure 1:
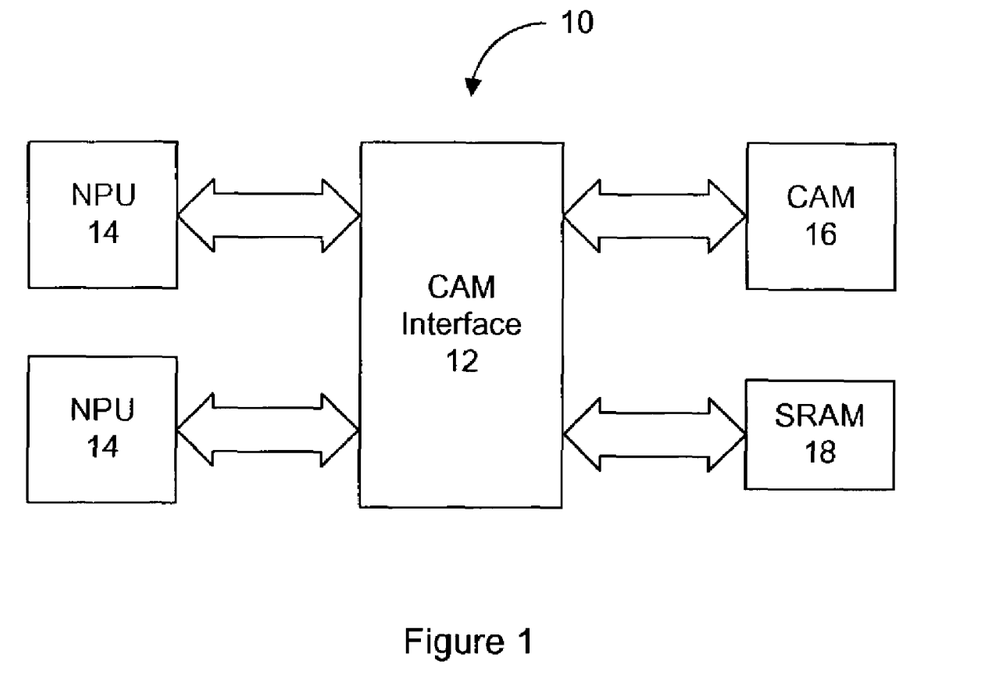
FIG. 1 is a block diagram of a CAM search sub-system.

FIG. 1 shows a general CAM search sub-system that uses CAM contexts. The sub-system 10 of FIG. 1 includes a CAM interface 12 coupled to a pair of network processing units (NPU) 14, a single CAM 16 and an SRAM 18. CAM interface 12 has two network processor interface ports for communicating with NPU's 14, but can have more than two network processor interface ports for communicating with additional NPU's 14. SRAM 18 includes additional data associated with the data entries in CAM 16. Those of skill in the art will understand that CAM 16 and SRAM 18 can include a single device or a number of cascaded devices respectively. CAM interface 12 includes a predetermined number of sets of registers associated with each network processor interface port for access by the corresponding NPU 14. In particular, CAM interface 12 includes a predetermined number of context registers that are set up, or written, according to instructions provided by NPU 14. In addition to context registers, CAM interface 12 includes output registers for storing the results of the search executed by CAM 16 and any associated data stored in SRAM 18, and a context pipeline for issuing the contexts to be executed. While FIG. 1 illustrates separate CAM interface 12 and CAM 16 blocks, both are typically implemented as separate integrated circuits. However, those of skill in the art will realize that both can be combined within a single device or a multi-chip module.

In operation, NPU 14 first sets up its associated predefined contexts that will be stored in the context registers of CAM interface 12. To execute a search operation, NPU 14 issues a command to execute one or more specific contexts. The specified context or contexts are fed to the context pipeline, and are sequentially sent to CAM 16 for execution. The results of the search by CAM 16 are returned to CAM interface 12, and are stored in the output registers with its associated data from SRAM 18. NPU 14 can then issue a command to CAM interface 12 to provide the search results stored in the output registers. Each context in CAM interface 12 is stored in an order known to the user such that a single command can be issued by NPU 14 to execute the particular search defined by that context.

Figure 2:
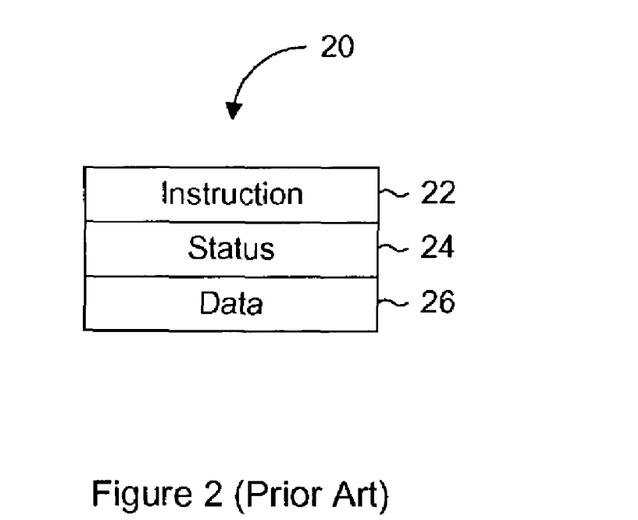
FIG. 2 is a graphical illustration of a prior art context.

FIG. 2 is a graphical illustration of a context for CAM 12 that can be stored in CAM interface 12. Context 20 includes an instruction field 22, a status field 24, and a data field 26. Instruction field 22 can include a number of bits to represent any one of the predefined CAM instructions. Status field 24 stores a status key associated with each word stored in the CAM array, and can include status, control and configuration bits. Accordingly, data field 26 stores a data key that preferably includes the same number of bits as a single word in the CAM array.

Valuable NPU cycles are required for setting up each context 20 of FIG. 2 in CAM interface 12. In the present example, it is assumed that the instruction field 22 of context 20 is 16 bits wide and the status field 24 is 16 bits wide. It is further assumed that the data field 26 is 288 bits wide, and the interface to NPU 14 is a 16 bit wide LA-1 interface data port. Those of skill in the art will understand that the fields can be configured with any desired width, and that additional user configurable fields can be added if desired. Therefore one NPU clock cycle is required for loading the instruction field 22, one cycle is required for loading the status field 24, and 18 cycles (at a single data rate) are required for loading the data field 26. Hence a total of 20 cycles are required for setting up the context.

A type of repeated search operation is a burst search operation utilizing multiple contexts. For example, each context of the burst search operation uses the same data key in its data field, but uses different status keys. A known method of issuing a burst search operation with the same data key and different status keys is to fill a predetermined number of contexts with the same data key and instruction, but with a different status key data in each context. An example illustrating a set of contexts for such a burst search operation is shown in FIG. 3.

Figure 3:
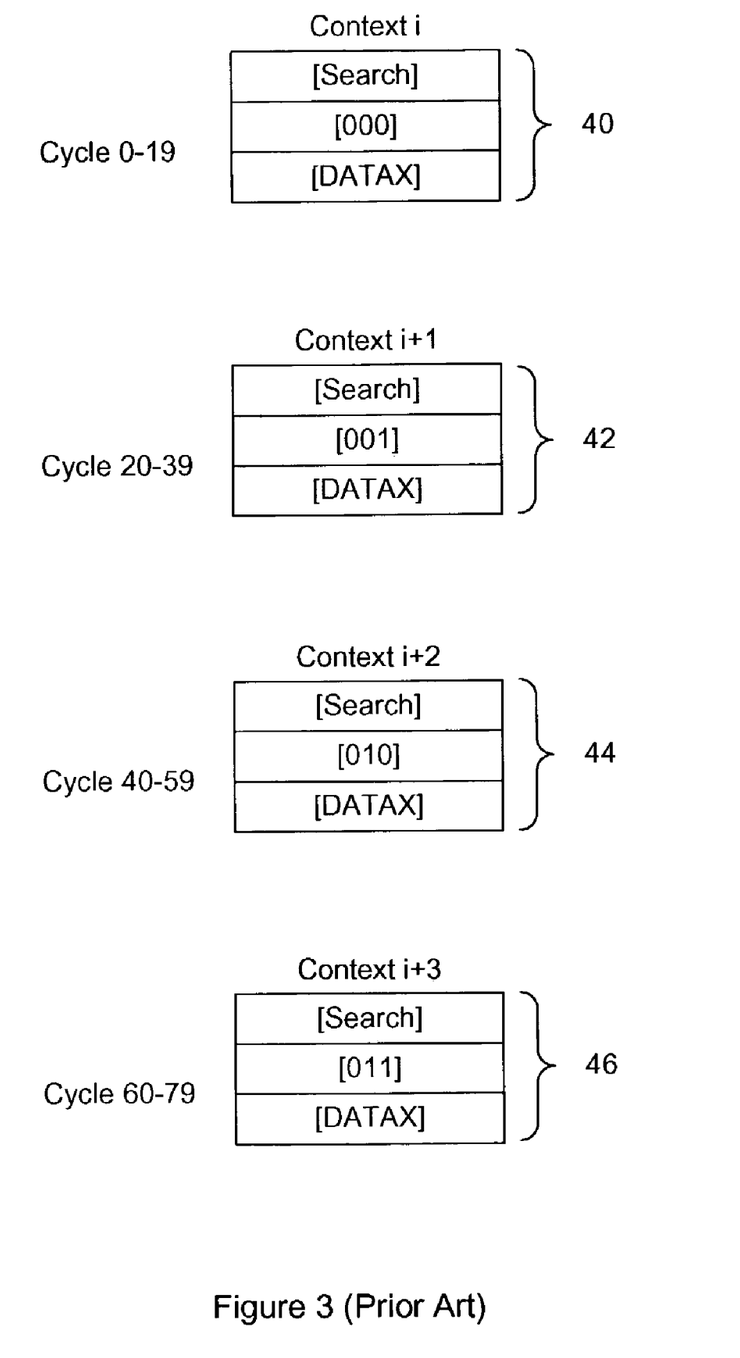
FIG. 3 shows contexts for a burst-of-4 search operation.

In FIG. 3, a context setup for a burst-of-4 search operation is shown using context 20 of FIG. 2 with the search sub-system of FIG. 1. It is assumed that the instruction field 22 of context 20 is 16 bits wide, the status field 24 is 16 bits wide, the data field 26 is 288 bits wide, and the interface to NPU 14 is a 16 bit wide LA-1 interface data port. For the purposes of illustrating the burst-of-4 search operation, only the three status bits of the status field shown in FIG. 3. Four contexts, 40, 42, 44 and 46 are successively setup with the same search instruction and data key, but with different status keys. Context 40, being the first context, is setup during cycles 0-19, with contexts 42, 44 and 46 each requiring 20 cycles for setup. A total of 80 cycles is thus required by NPU 14 for setting up the burst-of-4 search operation. Unfortunately, since the data keys of each context are identical to each other, the cycles required to set them up are considered wasted. The cycles required for setting up the contexts cannot be used for other operations by the NPU 14, hence reducing performance of search sub-system 10.

It is, therefore, desirable to provide a method for reducing the number of cycles required for setting up contexts.

SUMMARY OF THE INVENTION

It is an object of the present invention to obviate or mitigate at least one disadvantage of previous methods for setting up contexts for search operations. In particular, it is an object of the invention to provide a method of reducing the number of cycles required for setting up multiple contexts that will use the same data keys.

In a first aspect, the present invention provides a method for generating a data structure having an instruction field, a data field and a data re-use field. The method includes the steps of writing an instruction to the instruction field, setting a data re-use field to one of a false state and true state, and writing a data key to the data field if the data re-use field is set to the false state.

In embodiments of the present aspect, the step of writing can include retaining previously written data in the data field if the data re-use field is set to the true state, resetting the data field if the data re-use field is set to the true state, or copying a previous context data key to the data field if the data re-use field is set to the true state.

In a second aspect, the present invention provides a data structure executable by a system. The data structure includes an instruction field, a data field, and a data re-use field. The instruction field stores an instruction executable by the system. The data field stores data associated with the instruction. The data re-use field stores at least one bit of data, where the at least one bit of data can have a first state for instructing the system to use the stored data and a second state for instructing the system to use alternate data.

In an embodiment of the present aspect, the alternate data can be stored in the data field of another data structure and the data re-use field can include addressing bits for addressing the other data structure. In another embodiment of the present aspect, the alternate data is stored in the data field of a previously executed data structure.

In a third aspect, the present invention provides a context pipeline circuit for providing an instruction and data to a system. The context pipeline circuit includes an instruction pipeline, a data pipeline, and a data re-use circuit. The instruction pipeline receives the instruction and associated re-use data, and provides the instruction to the system. The data pipeline receives current data and provides the current data from an output of the data pipeline. The data re-use circuit receives the re-use data from the instruction pipeline, the current data from the output, and previously latched data. The data re-use circuit selectively provides as the data one of the current data and the previously latched data in response to a status of the re-use data.

In an embodiment of the present aspect, the data re-use circuit includes a multiplexor and a register. The multiplexor has a first input for receiving the current data, a second input for receiving the previously latched data, and a control input for receiving the re-use data. The multiplexor provides as the data one of the current data and the previously latched data in response to the status of the re-use data. The register latches the data and provides the latched data as the previously latched data.

In a fourth aspect, the present invention provides a method for performing repeated searches on a content addressable memory. The method includes the step of writing a plurality of data structures to context registers, where each data structure has an instruction field for storing an instruction, a data field for storing data and a data re-use field for storing a data re-use bit, the step of selecting a context for execution in the content addressable memory, the step of forwarding the instruction of the selected context to the content addressable memory, and the step of forwarding one of the data of the selected context and the data of another context to the content addressable memory in response to a state of the data re-use bit.

In an embodiment of the present aspect, the data re-use field stores addressing bits and the step of forwarding one of the data of the selected context and the data of another context includes forwarding the data of the other context addressed by the addressing bits. In another embodiment of the present aspect, the other context includes a previously executed context.

In a fifth aspect, the present invention provides a method for performing repeated searches on a content addressable memory. The method includes the step of writing a plurality of data structures to context registers, where each data structure has an instruction field for storing an instruction, a data field for storing data and a data reuse field for storing a data re-use bit, the step of selecting a first context for execution in the content addressable memory, the step of forwarding the instruction and the data of the first context to the content addressable memory, the step of selecting a second context for execution in the content addressable memory, the step of forwarding the instruction of the second context to the content addressable memory, and the step of forwarding one of the data of the second context and the data of the first context to the content addressable memory in response to a state of the data re-use bit.

BRIEF DESCRIPTION OF THE DRAWINGS

Embodiments of the present invention will now be described, by way of example only, with reference to the attached Figures, wherein.

DETAILED DESCRIPTION OF THE INVENTION

A method for reducing the number of cycles required for setting up content addressable memory contexts is disclosed. In particular, the method reduces the number of cycles required for setting up multiple contexts of burst operations, in which each context includes the same data key. Each context includes a special field that is set by the user, called a data re-use field. Setting the data re-use field to a first logic state indicates that the data from the corresponding context is to be used in the operation. Setting the data re-use field to a second logic state indicates that the data from the most recent operation is to be used instead. Hence the search data key can be written to a single context, avoiding consumption of cycles required for writing the same search data key to subsequent contexts of the burst operation.

Figure 4:
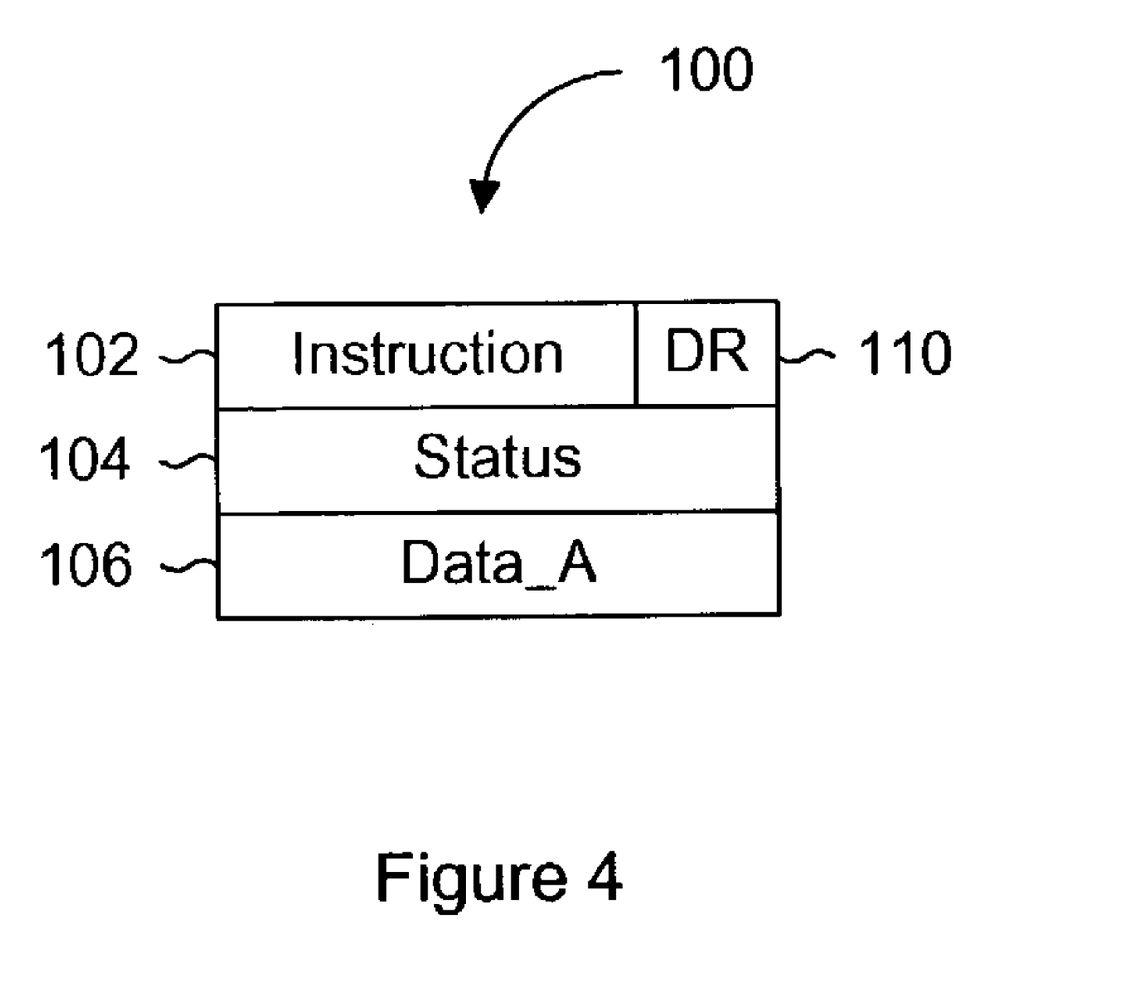
FIG. 4 is a graphical illustration of a context according to an embodiment of the present invention.

FIG. 4 is a graphical illustration of a CAM context according to an embodiment of the present invention. Context 100 includes instruction field 102, status field 104, and data field 106, which correspond to the same named fields 22, 24 and 26 respectively of context 20 shown in FIG. 2. Context 100 includes an additional field called a data re-use field 110 that can be set or reset by the user. Data re-use field 110 is preferably located in the same row as instruction field 102, meaning that it is written in the same cycle that the instruction field 102 is written. Alternatively, data re-use field 110 can be written in the same cycle that the status field 104 is written, or any field that is written in each context. As will be described later, the data re-use field preferably stores a single bit of data that instructs the CAM interface 12 to use either the data key from the current context or an alternate data key, such as the data key from the previous context, for a search operation that is to be executed. Thus in setting up contexts for burst search operations, the NPU does not write the data fields 106 for contexts following the initial context, saving a significant number of cycles that can be used for other NPU operations.

Figure 5:
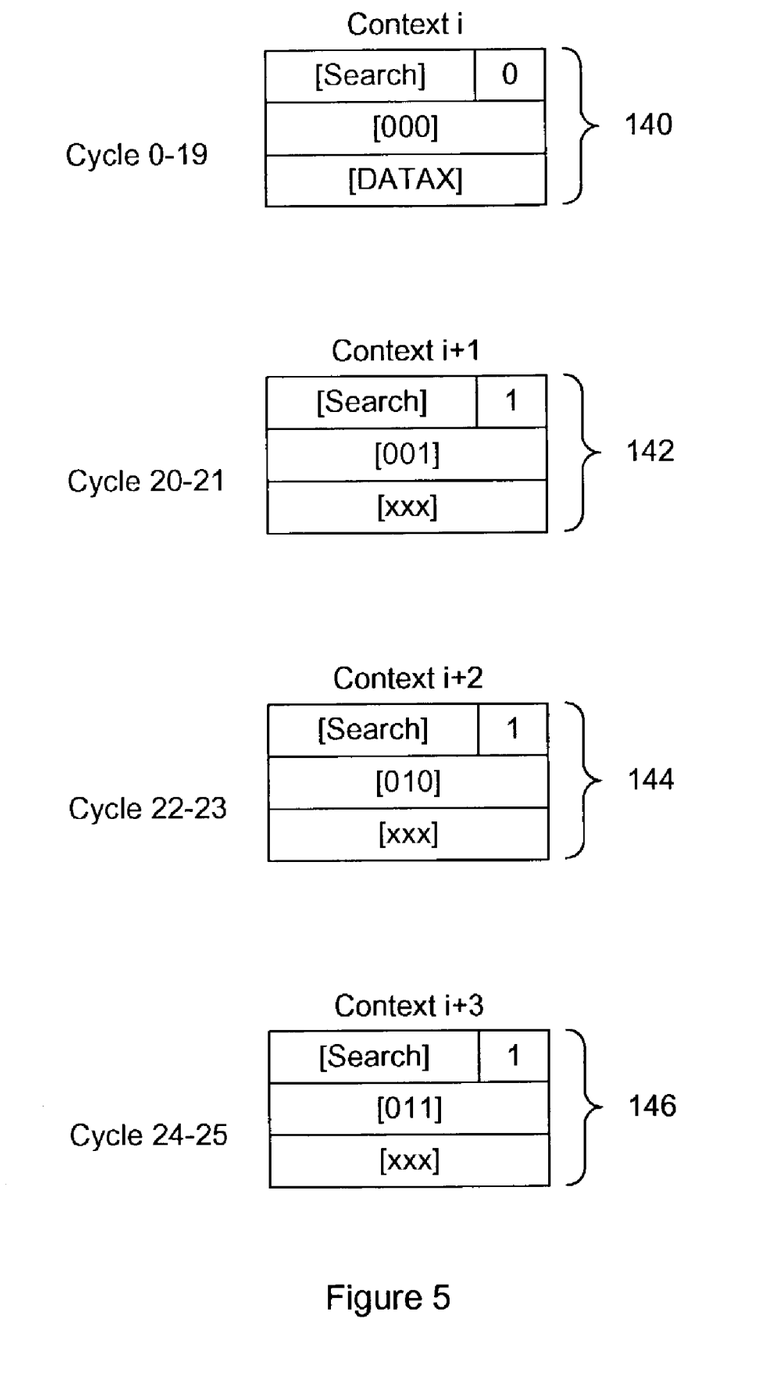
FIG. 5 shows the context of FIG. 4 used in a burst-of-4 search operation according to an embodiment of the present invention.

FIG. 5 shows a context setup for a burst-of-4 search operation using context 100 shown in FIG. 4. Four contexts, 140, 142, 144 and 146 are successively setup with the same search instruction for searching the same data key DATAX. Only the status key changes in each context. Context 140, being the first context, requires the full 20 cycles for setup since the search instruction, data re-use bit, status key and data key DATAX are written to their respective fields. The data re-use field of context 140 is reset to a false state, such as a logic "0" level, at the same time the search instruction is written to the instruction field. During setup of subsequent context 142, the search instruction and a new status key are written in cycles 20 and 21, and the data re-use field is set to a true state, such as a logic "1" level. Setup of context 144 and 146 proceed in the same manner as discussed for context 142. Because the NPU does not write DATAX to the data field of contexts 142, 144 and 146 the burst-of-4 search operation only requires 26 cycles to setup. In this particular example, the setup of the burst-of-4 search operation shown in FIG. 5 consumes a total of 26 NPU cycles instead of the 80 NPU cycles required for setup of the burst-of-4 search operation shown in FIG. 3. Hence the throughput of the CAM using context 100 is increased as more NPU cycles become available for other operations. In use, the data field registers can be reset if the data re-use field is set, or they can retain data that was previously written to it. The data field contents of contexts having their data re-use field set is not important since this data is not used in the search operation.

Figure 6:
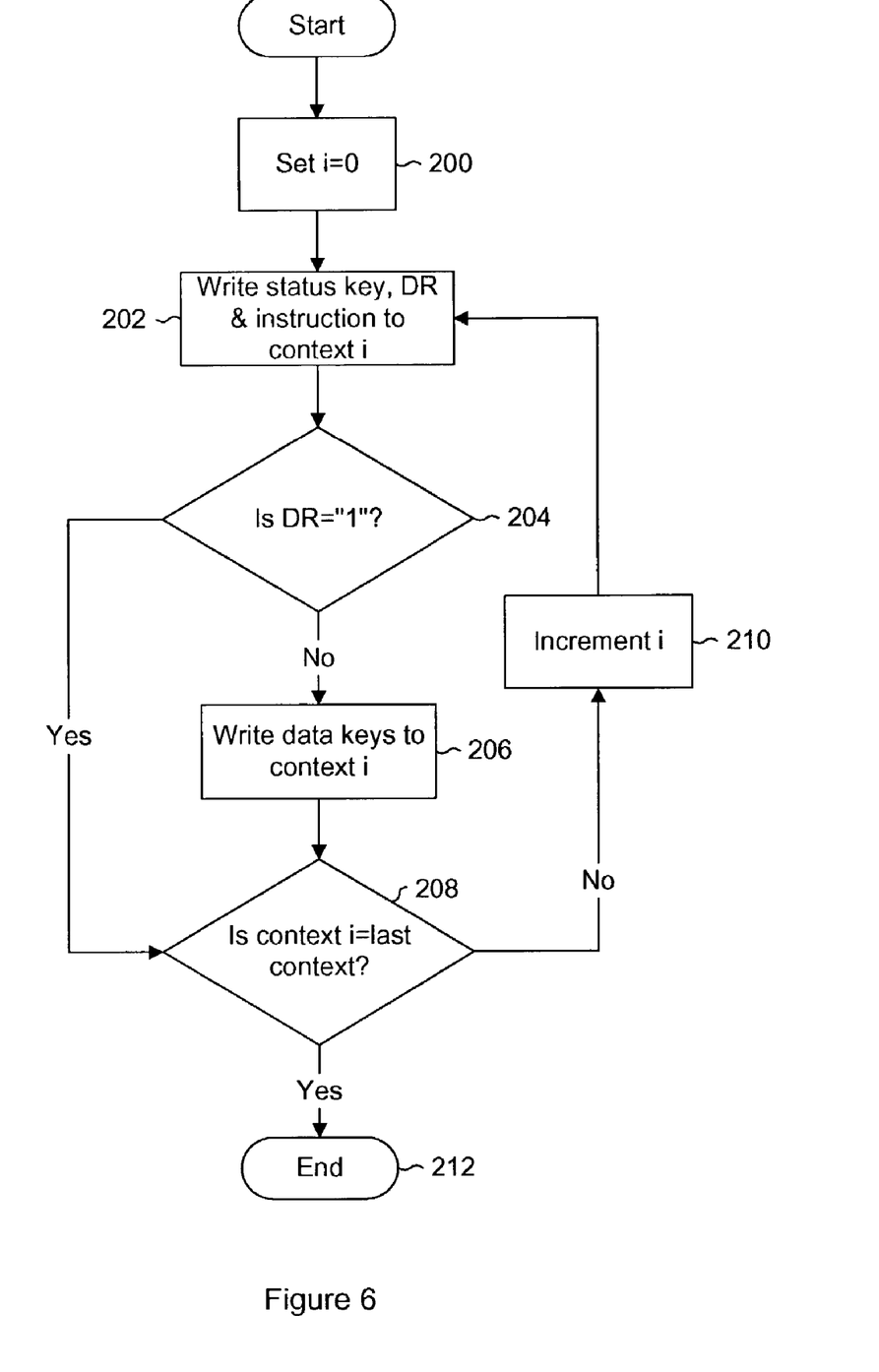
FIG. 6 is a flow chart illustrating a method of setting up a burst search operation according to an embodiment of the present invention.

A flow chart illustrating the general procedure for generating a burst-of-i search operation, where i can be any integer number, is shown in FIG. 6. The presently shown procedure can be used to set up the burst-of-4 search operation shown in FIG. 5. Assuming that the appropriate commands are received from an NPU, the process starts at step 200 to setup the initial context 0. At step 202 the search instruction and status key are written to context 0. The data re-use field is reset to the false state (or logic "0") at the same time the search instruction is written. The state of the data re-use field is checked at step 204, and since the data re-use field is reset to logic "0" for context 0, the data key is written to the data field in step 206. At this point in the process, 20 cycles have been consumed to set up context 0. From step 208, the process proceeds to step 210 to increment i, and then back to step 202 to begin setup of next context 1. Otherwise, the process ends at step 212. For setting up context 1, the data re-use field is set to the true state of logic "1" as the search instruction and the new status key are written. At step 204, the state of the data re-use field of context 1 is checked and the process proceeds directly to step 208 to bypass step 206. Hence the 18 cycles required for writing the data key is skipped. The process can then loop through steps 202, 208 and 210 as many times as desired.

Once the contexts are setup, they are ready to be issued to the CAM 16 in response to a command from the NPU 14. As previously mentioned, the issued contexts are loaded into a pipeline for execution by CAM 16. While the CAM interface 12 of FIG. 1 loads the CAM pipeline with instructions and data of the issued context, a new CAM interface has been designed to accommodate the data re-use field 110 of context 100.

Figure 7:
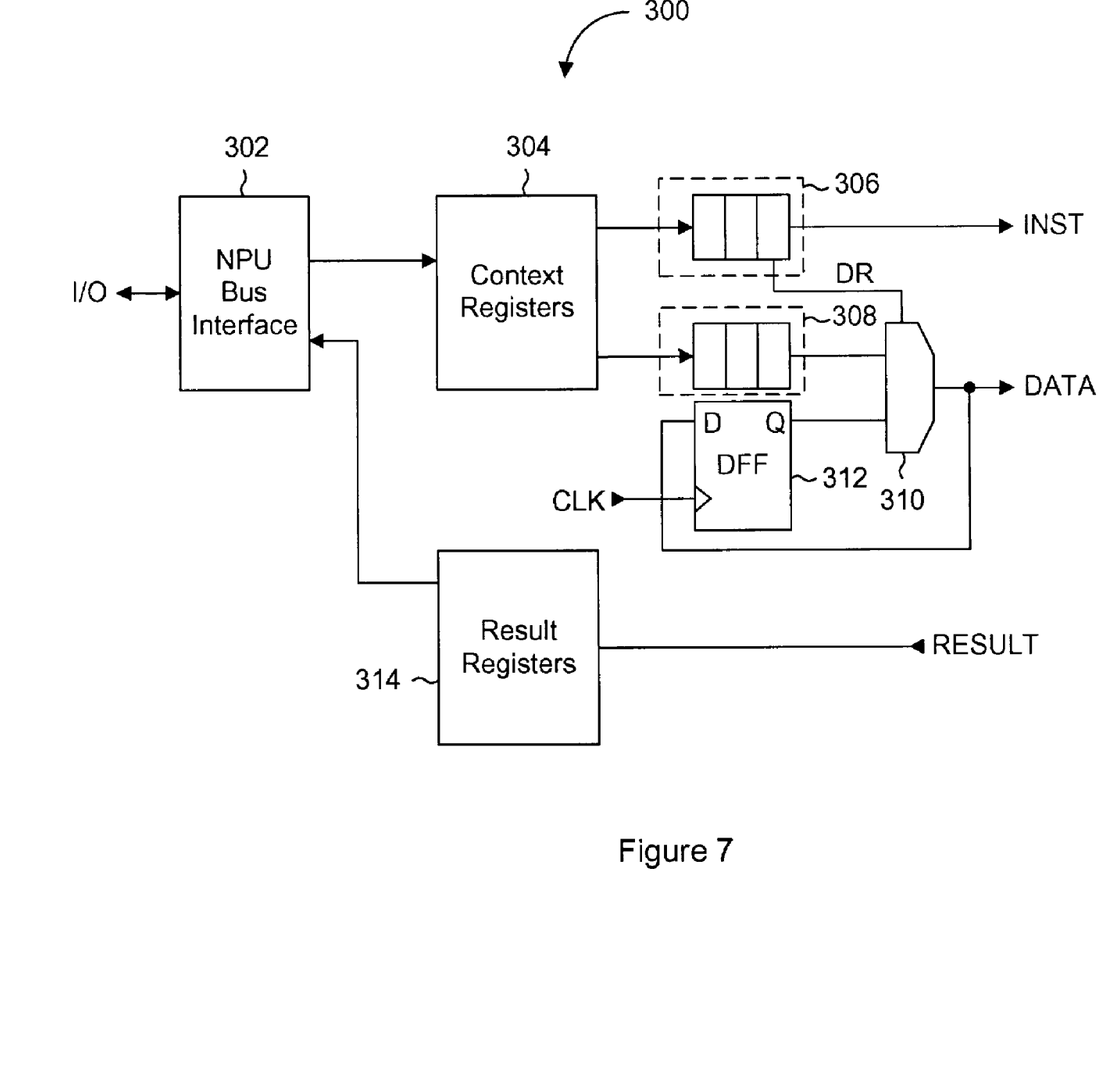
FIG. 7 is a block diagram of a CAM interface circuit according to an embodiment of the present invention; and, FIG. 8 is a block diagram of an alternative CAM interface circuit according to an embodiment of the present invention.

FIG. 7 is a block diagram of a CAM interface circuit according to an embodiment of the present invention. CAM interface circuit 300 is an example implementation that can be used for CAM interface 12 of FIG. 1. It is noted that other circuits of CAM interface circuit 300 are not shown as they are not relevant to the embodiments of the present invention, but those of skill in the art will understand that they are necessary for proper operation of the search sub-system. CAM interface circuit 300 includes a bus interface block 302 in communication with an NPU 14 through its I/O port, a context register block 304, a context pipeline comprising instruction pipeline 306 and data pipeline 308, a data re-use circuit comprising multiplexor 310 and flip-flop 312, and result registers block 314.

Bus interface 302 can be a 16 bit wide LA-1 port interface for example, for sending data to context registers block 304, for receiving data from result registers block 314, and for receiving commands to execute contexts.

In the present example, context registers block 304 can include enough registers to store 32 sets of contexts 100, although context registers block 304 can have enough registers to store any number of contexts. The instruction pipeline 306 includes sets of registers for shifting an instruction from the instruction field 102, the status bits from the status field 104, and the data re-use bit from data re-use field 110 context 100 from the first pipeline stage to the last pipeline stage having an output INST. It is noted in the present embodiment of context 100 that the bit from the data re-use field 110 is not forwarded to the CAM, and is used within CAM interface circuit 300. In the last pipeline stage, the data re-use bit is provided to control MUX 310. The data pipeline 308 includes sets of registers for shifting the data key from the data field 106 of context 100 from the first pipeline stage to its last pipeline stage, where the output of the last pipeline stage is provided to a first input of MUX 310. Accordingly, each stage of the instruction pipeline 306 corresponds with each stage of the data pipeline 308.

MUX 310 receives the Q-output of flip-flop 312 and has its output DATA fed back to the D-input of flip-flop 312. It should be noted that flip-flop 302 represents a set of registers having a width equal to the width of each stage of data pipeline 308. After INST and DATA are provided to CAM 16 of FIG. 1 for execution of a search operation, the search results and any corresponding data from SRAM 18 are provided via input SEARCH, where they are stored in result registers block 314.

The data re-use circuit can selectively provide data from one of the last stage of the data pipeline 308 and the Q-output of flip-flop 312 in response to the state of the data re-use bit DR. For example, if DR is at the logic "0" level, then MUX 310 passes data from the last stage of data pipeline 308. Otherwise, MUX 310 passes the data provided by flip-flop 312.

An example of an issued burst-of-4 search operation is described with reference to FIG. 7. Assuming that the burst-of-4 search contexts are configured as illustrated in FIG. 5, NPU 14 will issue a command to execute the burst-of-4 search operation. The instruction, status bits and data re-use bit of context 140 are first loaded into the instruction pipeline 306 at the same time the data key of context 140 is loaded into the data pipeline 308. The fields of contexts 142, 144 and 146 are successively loaded into instruction pipeline 306 and data pipeline 308 respectively. Because context 140 has its data re-use bit DR set to the logic "0" state, MUX 310 passes the data in the last stage of the data pipeline 308 to CAM 16. The data key of context 140 is fed back and stored in flip-flop 312. When context 142 is to be executed, the logic "1" state of the data re-use bit DR sets MUX 310 to pass the stored data key of flip-flop 312 instead of the data stored in the last stage of data pipeline 308. Thus the instruction and status bits of context 142 and the data key of context 140 are passed to CAM 16 for the next search operation. This sequence repeats for contexts 144 and 146 in which their respective instructions and status bits are sent to CAM 16 with the data key of context 140.

Figure 8:
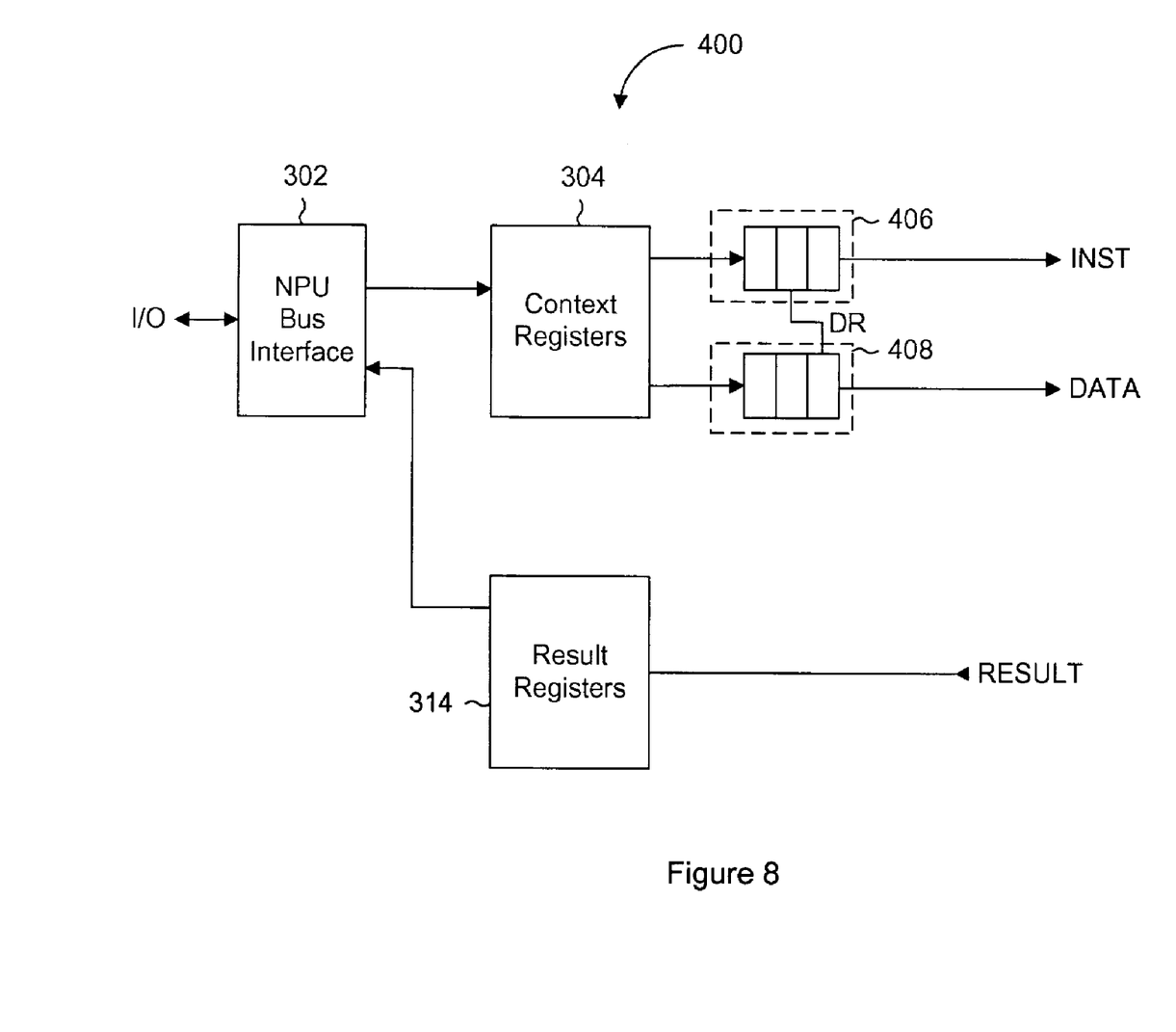

FIG. 8 illustrates an alternate embodiment of the CAM interface circuit shown in FIG. 7. While the circuit of FIG. 7 employs a feed back configuration to re-use data, the circuit of FIG. 8 employs a feed forward configuration to re-use data. CAM interface circuit 400 is similar to CAM interface circuit 300 of FIG. 7, with the same numbered elements being previously described. In the present embodiment, the data re-use bit DR is provided by the second last stage of instruction pipeline 406 and received by the last stage of data pipeline 408, and the data re-use circuit of FIG. 7 is not used. The last stage of data pipeline 408 can be a standard well known flip-flop circuit with an active low enable input for receiving DR. Hence, if DR is at the "0" logic level, the last stage of data pipeline 408 clocks in new data from the previous stage. Otherwise, the previously stored data is held for use by the next search instruction.

The CAM interface circuits shown in FIGS. 7 and 8 re-use previous data from their data pipelines in response to the data re-use bit DR after the contexts have been loaded into the context pipeline. In yet another alternative embodiment, a controller circuit within CAM interface circuit (not shown) can check the status of the re-use bit DR of an issued context prior to loading it into the context pipeline. This permits contexts to be issued in any order.

In a first example of the alternate embodiment, the data of the current context being issued can be loaded into the data pipeline with its corresponding instruction and status bits if the DR bit is not set. On the other hand, if the DR bit is set, the controller takes the data from the previously issued context and loads it into the data pipeline. This present embodiment would use a switching or muxing element to select one of the current and previous context data fields.

In a second example of the alternate embodiment, the controller checks the status of the DR bit as the instruction field of a context is being setup or written. If the DR bit is not set then the controller receives the data key provided by the NPU and writes it into the data field of the current context being setup. Otherwise, if the bit is set then the controller copies the data key from the previously setup context into the data field of the current context being setup. In this present example, a standard context pipeline circuit can be used for receiving and passing the issued contexts.

Therefore, a CAM search sub-system employing contexts having a data re-use field can increase search throughput by saving port access cycles. Although a context having a single data field is shown in the present embodiments, contexts having two or more data fields can also be used.

While the embodiments of the present invention use the logic "0" level to represent the false or reset state and the logic "1" to represent the true or set state, the logic levels can be inverted in alternate embodiments. The method for saving NPU cycles when setting up contexts for a burst-of-i search operation can also be used to save NPU cycles when only the data key for the burst-of-i search operation is to be updated. More specifically, in a previously preset burst-of-i search operation, only the data field of the initial context is updated to effectively update all the subsequent contexts belonging to the burst-of-i search operation.

Although the data re-use field is applied to the data key field of a CAM context, the data re-use field can equally be applied to the status key field. In another alternative embodiment of the present invention, the CAM context can include two data re-use fields or a single data field comprising two or more bits. The first data re-use field can be associated with the data key field and the second data re-use field can be associated with the status key field. In an embodiment where the data reuse field includes a plurality of bits, at least one of the bits can be used to indicate that data re-use is enabled and the other bits can be used as addressing bits to indicate the context having the data key to be used when that context is issued.

The method and circuits of re-using data is not limited to CAM devices. The methods and circuits disclosed in the embodiments of the present invention can be used in any system where a controller issues repetitive, substantially similar contexts that are to be executed by another device.

The above-described embodiments of the invention are intended to be examples of the present invention. Alterations, modifications and variations may be effected the particular embodiments by those of skill in the art, without departing from the scope of the invention which is defined solely by the claims appended hereto.

What is claimed is:

1. A method for generating a data structure for performing a search of a content addressable memory (CAM), the data structure having an instruction field, a search data field and a data re-use field, the method comprising:

writing an instruction to the instruction field;

setting a data re-use field to one of a false state and true state; and, writing a context data key, for effecting the search of the CAM, to the search data field if the data re-use field is set to the false state, otherwise writing a previous context data key, for effecting the search of the CAM, to the search data field if the data re-use field is set to the true state.

2. The method of claim 1, wherein the step of writing the context data key includes retaining previously written data in the search data field if the data re-use field is set to the true state.

3. The method of claim 1, wherein the step of writing the context data key includes resetting the search data field if the data re-use field is set to the true state.

4. The method of claim 1, wherein the step of writing the context data key includes copying a previous context data key to the search data field if the data re-use field is set to the true state.

5. A context pipeline circuit for providing an instruction and data to a content addressable memory (CAM), the context pipeline circuit comprising:
    an instruction pipeline for receiving the instruction and associated re-use data, and for providing the instruction to the CAM;
    a data pipeline for receiving current search data and providing the current search data from an output of the data pipeline; and,
    a data re-use circuit for receiving the re-use data from the instruction pipeline, the current search data from the output, and previously latched search data, the data re-use circuit selectively providing as the search data for performing a search of the CAM one of the current search data and the previously latched search data in response to a status of the re-use data.

6. The context pipeline circuit of claim 5, wherein the data re-use circuit includes
    a multiplexor having a first input for receiving the current search data, a second input for receiving the previously latched search data, and a control input for receiving the re-use data, the multiplexor providing as the search data one of the current search data and the previously latched search data in response to the status of the re-use data, and
    a register for latching the search data and for providing the latched search data as the previously latched data.

7. A method for performing repeated searches on a content addressable memory (CAM), the method comprising:
    writing a plurality of data structures to context registers for performing searches of the CAM, each data structure having an instruction field for storing an instruction, a data field for storing search data and a data re-use field for storing a data re-use bit;
    selecting a context for execution in the CAM;
    forwarding the instruction of the selected context to the CAM; and,
    forwarding one of the search data of the selected context and the search data of another context to the CAM in response to a state of the data re-use bit.

8. The method of claim 7, wherein the data re-use field stores addressing bits, and wherein the step of forwarding one of the search data of the selected context and the search data of another context includes forwarding the search data of the other context addressed by the addressing bits.

9. The method of claim 7, wherein the other context includes a previously executed context.

10. A method for performing repeated searches on a content addressable memory (CAM), the method comprising:
    writing a plurality of data structures to context registers, each data structure having an instruction field for storing an instruction, a data field for storing search data for performing a search of the CAM, and a data reuse field for storing a data re-use bit;
    selecting a first context for execution in the CAM;
    forwarding the instruction and the search data of the first context to the CAM;
    selecting a second context for execution in the CAM;
    forwarding the instruction of the second context to the CAM; and
    forwarding one of the search data of the second context and the search data of the first context to the CAM in response to a state of the data re-use bit.

* * * * *